United States Patent
Curzi et al.

(10) Patent No.: US 9,294,125 B2
(45) Date of Patent: Mar. 22, 2016

(54) LEVERAGING LANGUAGE STRUCTURE TO DYNAMICALLY COMPRESS A SHORT MESSAGE SERVICE (SMS) MESSAGE

(75) Inventors: Francesca Curzi, Rome (IT); Ilaria Gorga, Rome (IT); S. Benedetta Stasi, Rome (IT); Edoardo Turano, Rome (IT)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1057 days.

(21) Appl. No.: 13/341,276

(22) Filed: Dec. 30, 2011

(65) Prior Publication Data

US 2013/0173248 A1 Jul. 4, 2013

(51) Int. Cl.
*H03M 7/30* (2006.01)
*H03M 7/40* (2006.01)

(52) U.S. Cl.
CPC ............ *H03M 7/6088* (2013.01); *H03M 7/607* (2013.01); *H03M 7/3088* (2013.01); *H03M 7/40* (2013.01)

(58) Field of Classification Search
CPC . H03M 7/6064; H03M 7/607; H03M 7/6076; H03M 7/6082; H03M 7/6088; H03M 7/70; G06F 17/20; G06F 17/211; G06F 17/27; G06F 17/271; G06F 17/274; G06F 17/2755
See application file for complete search history.

(56) References Cited

U.S. PATENT DOCUMENTS

| | | | |
|---|---|---|---|
| 5,884,248 A | 3/1999 | Hall | |
| 7,584,091 B2 * | 9/2009 | Gavieiro-Villatte et al. | 704/9 |
| 7,827,315 B2 | 11/2010 | Kirkland | |
| 2002/0156618 A1 * | 10/2002 | Mathur et al. | 704/9 |
| 2003/0217100 A1 * | 11/2003 | Kronk | 709/203 |
| 2004/0093328 A1 * | 5/2004 | Damle | 707/3 |
| 2004/0148569 A1 * | 7/2004 | Sengodan | 715/513 |
| 2004/0189484 A1 * | 9/2004 | Li | 340/825.19 |
| 2004/0249885 A1 * | 12/2004 | Petropoulakis et al. | 709/204 |
| 2005/0049852 A1 * | 3/2005 | Chao | 704/9 |
| 2005/0234702 A1 * | 10/2005 | Komiya | 704/2 |
| 2006/0036428 A1 * | 2/2006 | Ramsey | 704/9 |
| 2006/0129376 A1 * | 6/2006 | Wiener | 704/1 |
| 2007/0003147 A1 * | 1/2007 | Viola et al. | 382/229 |
| 2007/0130313 A1 * | 6/2007 | King | 709/223 |
| 2007/0250432 A1 * | 10/2007 | Olof-Ors et al. | 705/37 |
| 2007/0299925 A1 * | 12/2007 | Kirkland | 709/206 |
| 2008/0090219 A1 * | 4/2008 | Wilson et al. | 434/310 |
| 2008/0091408 A1 * | 4/2008 | Roulland et al. | 704/9 |
| 2008/0286731 A1 * | 11/2008 | Rolstone | 434/157 |
| 2009/0042589 A1 | 2/2009 | Park et al. | |
| 2010/0131900 A1 | 5/2010 | Spetalnick | |
| 2010/0254410 A1 | 10/2010 | Collins | |
| 2011/0098999 A1 * | 4/2011 | Amini et al. | 704/2 |

FOREIGN PATENT DOCUMENTS

EP 1262931 A1 4/2002

* cited by examiner

*Primary Examiner* — Eric Yen
(74) *Attorney, Agent, or Firm* — Patents on Demand P.A.; Brian K. Buchheit; Scott M. Garrett (57) ABSTRACT

A message within a message queue can be identified. The message queue can be within a software entity of a computing device. The message can be analyzed to determine an encoding scheme to apply to the message. The message can be encoded using the encoding scheme to create an encoded message. The encoding scheme can be a word level encoding scheme, a language-based encoding scheme, or a grammar encoding scheme.

18 Claims, 4 Drawing Sheets

LEVERAGING LANGUAGE STRUCTURE TO DYNAMICALLY COMPRESS A SHORT MESSAGE SERVICE (SMS) MESSAGE

BACKGROUND

The present invention relates to the field of Short Message Service compression and, more particularly, to leveraging language structure to dynamically compress a Short Message Service (SMS) message.

A Short Message Service message can be a text communication which allows users to send and/or receive a short message. The short message can contain a limited number of characters. The message size can be limited by the constraints of the signaling protocol used to transmit the message. For example, a typical SMS message conveyed over a cellular network can be limited to 160 7-bit characters. To maximize transmission capacity and minimize network load, SMS messages are often compressed. One traditional approach to minimizing network load is through the use of "single character" encoding techniques. For example, a Huffman coding can be utilized to provide lossless data compression for the message based on encoding each character in the message with a variable-length code. However, due to the large volume of SMS messages communicated through networks, traditional compression schemes fail to adequately provide maximum network throughput.

Frequently, users often create text messages which exceed the length of the SMS message constraint. When this occurs, multiple SMS messages (e.g., multipart) are created and conveyed which can be reconstructed upon delivery into the original message. Even when traditional approaches to encoding are applied, frequently multipart messages can result. These multipart messages can create significant overhead within a carrier network. Overhead such as additional header information for each message and routing overhead can contribute to increased network loads. Further, in many instances, these multipart messages can incur additional data charges for the user, which can diminish the user experience.

BRIEF SUMMARY

One aspect of the present invention can include a system, an apparatus, a computer program product, and a method for leveraging language structure to dynamically compress a Short Message Service (SMS) message. A message within a message queue can be identified. The message queue can be within a software entity of a computing device. The message can be analyzed to determine an encoding scheme to apply to the message. The message can be encoded using the encoding scheme to create an encoded message. The encoding scheme can be a word level encoding scheme, a language-based encoding scheme, or a grammar encoding scheme.

Another aspect of the present invention can include an apparatus, a method, a computer program product, and a system for leveraging language structure to dynamically compress a Short Message Service (SMS) message. A transmission engine can be configured to encode or decode a message within a message queue within a software entity of a computing device. The encoding and decoding can be associated with a word level encoding scheme, a language-based encoding scheme, or a grammar encoding scheme. A data store can be able to persist a mapping associated with the message. The mapping can indicate the encoding scheme or decoding scheme associated with the message within the message queue.

Yet another aspect of the present invention can include an apparatus, a method, a system, and a computer program for leveraging language structure to dynamically compress a Short Message Service (SMS) message. A Short Message Service (SMS) message can be detected within a message queue having multiple endpoint device recipients. The message queue can be associated with a SMS Center (SMSC). An encoding scheme can be selected to encode the SMS message based on at least one ruleset. The SMS message can be encoded using an encoding scheme. The encoding scheme can be a word level encoding scheme, a language-based encoding scheme, or a grammar encoding scheme. An encoded message associated with the encoding scheme can be generated. The encoded message can be conveyed to a proximate network element communicatively linked to an endpoint device recipient of the message and an endpoint device recipient of the message.

DETAILED DESCRIPTION

The present disclosure is a solution for language structure to dynamically compress a Short Message Service (SMS) message. In the solution, an encoding engine can utilize word frequency, language structure, and grammar to intelligently compress an SMS message. In one instance, the engine can analyze the SMS message to determine a distribution frequency of words within the message. In the instance, a Huffman algorithm can be utilized to optimally compress/decompress the message by creating a coding tree where each node is associated with a word and a bit sequence. In another instance, the SMS message can be examined by the engine to determine language constructs which can be encoded/decoded based on the language rules. In the instance, select grammatical parts of speech (e.g., article) can be omitted during encoding and automatically deduced (e.g., based on the language rules) during decoding. In yet another instance, grammatical rules can be leveraged to allow parts of speech to be encoded/decoded.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
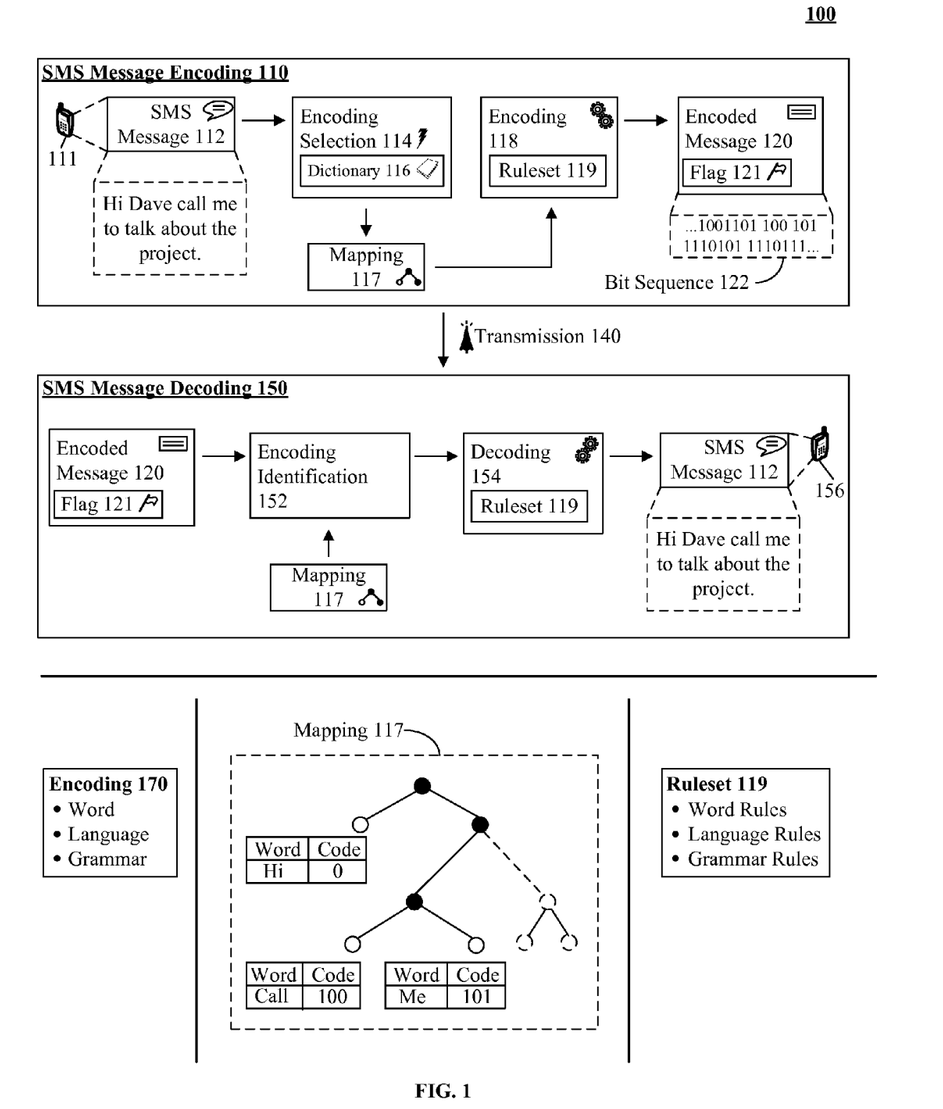
FIG. 1 is a schematic diagram illustrating a scenario for leveraging language structure to dynamically compress a Short Message Service (SMS) message in accordance with an embodiment of the inventive arrangements disclosed herein.

FIG. 1 is a schematic diagram illustrating a scenario 100 for leveraging language structure to dynamically compress a Short Message Service (SMS) message in accordance with an embodiment of the inventive arrangements disclosed herein. Scenario 100 can be present in the context of method 200, system 300, and/or embodiment 400, 440. Scenario 100 can one or more phases such as SMS message encoding 110 phase, transmission 140 phase, and SMS message decoding 150 phase. It should be appreciated that scenario 100 can include additional phases such as an encryption phase, an authentication phase, and the like.

In the scenario 110, a message can be encoded (e.g., encoded message 120) with an encoding 170 type utilizing mapping 117. In the scenario 150, the encoded message 120 can be decoded by identifying encoding 170 type associated with message 120 and employing mapping 117 to enable decoding. In the scenario 100, a variable bit encoding scheme can be applied to a message 112 to enable optimized compression of message 112. In the scenario 100, ruleset 119 can be used to control how message 120 can be encoded/decoded. That is, ruleset 119 can be utilized to generate mapping 117 which can facilitate encoding/decoding of message 112.

It should be appreciated that the disclosure can leverage commonalities present in text messaging conversations, language, and/or grammar to facilitate encoding/decoding. The disclosure can utilize word based encoding to take advantage of frequently occurring words. For example, greetings such as "hello", "hi", and "hey" which occur frequently in text messaging conversations can be encoded with a short bit sequence and words which occur less frequently with a longer bit sequence. Similarly, languages often include common constructs which can repeat frequently. For example, a general rule which is common among different languages is that an article needs to be used before a noun in a sentence. In one instance, ruleset 119 can be employed to intelligently encode common constructs. In the instance, when an article and a noun is present within a message, the noun can be encoded only and can be decoded by usage of language rules (e.g., language rules of ruleset 119). Ruleset 119 can include word based rules, language based rules, grammar based rules, and the like. Further, grammar rules of languages can be replicated within a ruleset (e.g., ruleset 119) permitting optimal encoding and decoding of parts of speech. In one embodiment, a verb part of speech can be encoded as an infinitive form and decoded based on usage in a text message conversation. For example, based on the subject of a sentence the verb can be automatically conjugated using grammar rules (e.g., grammar rules of ruleset 119).

In one embodiment, encoding/decoding can be performed within end-point devices (e.g., mobile phones 111, 156) enabling maximum network load reduction.

In another embodiment, encoding/decoding can be performed within an SMS Center of a telephony network. In yet another embodiment, encoding can be performed within an SMS Center of a telephony network and decoding can be performed within an end-point device (e.g., mobile phone 156).

SMS message encoding 110 phase can include encoding selection 114 step and encoding step 118. In SMS message encoding 110 phase, the SMS message 112 can be composed within a mobile phone 111. For example, a user can input a message 112 with contents "Hi Dave call me to talk about the project" into an SMS text messaging application. The message 112 can be compressed using intelligent selection (e.g., encoding selection 114) of encoding 170 types producing encoded message 120. That is, based on the analysis of the message performed in encoding selection 114 an appropriate encoding 170 type can be selected which enables maximum compression. That is, selection 114 can be utilized to determine encodings which can result in optimal computing resource savings (e.g., network load, processor load). Selection 114 can be configured (e.g., using settings 328) to favor fast encoding/decoding speed, minimize encoded message length 120, and the like. The encoding 170 types can include, but is not limited to, word level encoding, language based encoding, grammar based encoding, and the like.

Based on the encoding 170 type selected, a mapping 117 can be produced. In one instance, mapping 117 can include words within message 112 organized as a binary tree. In the instance, mapping 117 can organize words using dictionary 116 to optimally associate a bit sequence with a word. For example, words with high frequency within message 112 can be associated with short bit sequences and words with low frequency can be associated with longer bit sequences.

In one embodiment, a rule can be encoded into the bit sequence of each word indicating an encoding 170 type for each word. In the embodiment, a value of one can be utilized for word based encoding without language rules and a value of two for encoding based on word and language rules. For example, the sentence "Caro come stai" can be encoded as "11011", where the first bit can be set to one to indicate rule usage, the subsequent bits can be the bit sequence associated with the word, and the last bit can identify the rule number. In another example, the verb "Ho chiamato" can be coded as infinite verb "chiamare" with code "100", verbal tense of past perfect with code "0010" and first singular person with code "010" resulting in "ho chiamato" encoded as "1000010010".

Figure 4:
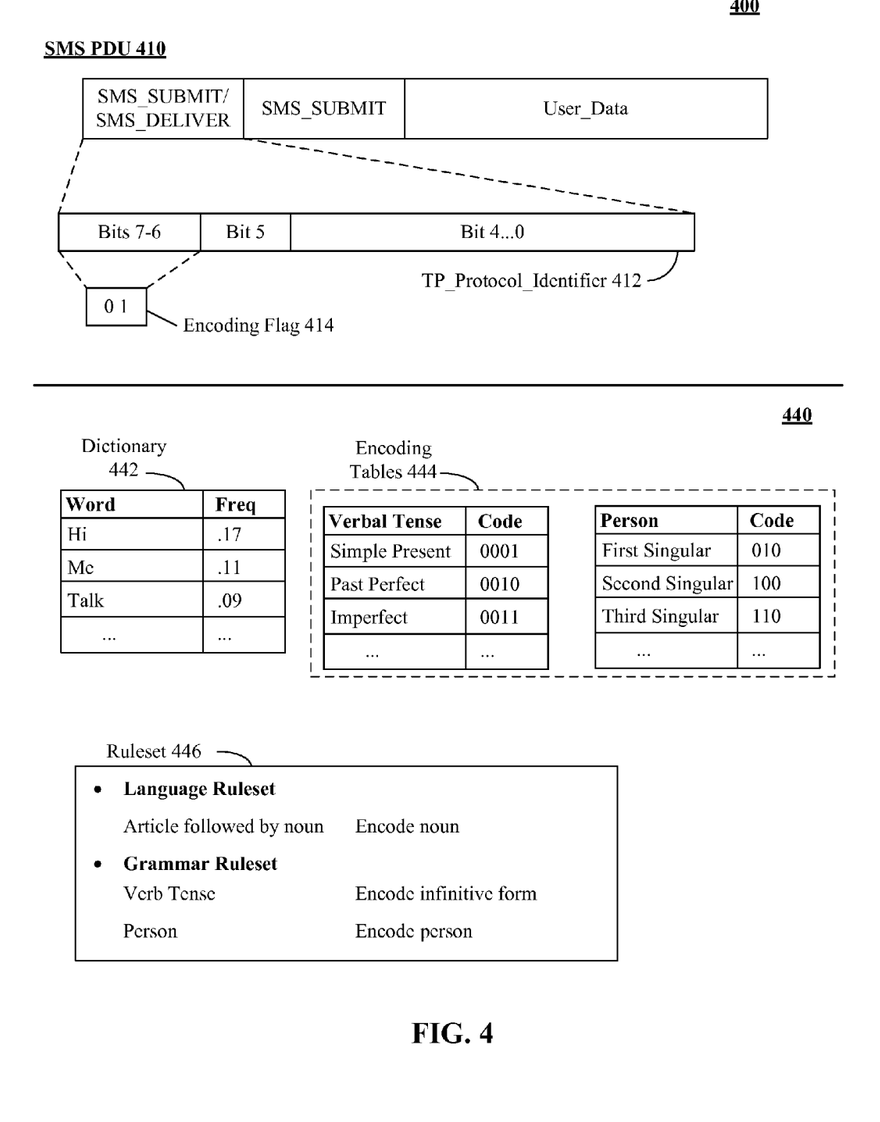
FIG. 4 is a schematic diagram illustrating an embodiment for a packet data unit and encoding artifacts for leveraging language structure to dynamically compress a SMS message in accordance with an embodiment of the inventive arrangements disclosed herein.

Dictionary 116 can be a dataset associated with one or more messages 112. For example, dictionary 116 can include only words "Hi Dave call me to talk about the project" from message 112. The dataset can include, but is not limited to, one or more words, a frequency value associated with each word, and the like. For example, the dataset can be a probability distribution (e.g., probability table, encoding tables 444). In one instance, dictionary 116 can be a mobile phone T9 dictionary. Dictionary 116 can enable support for non-standard (e.g., slang) and/or colloquial (e.g., pidgin) languages such as Creole, Spanish-English (e.g., Span-glish), and the like.

Mapping 117 can be employed by the encoding 118 step to produce encoded message 120 based on ruleset 119. In one instance, mapping 117 can be a frequency-sorted binary tree. For example, a portion of mapping 117 can encode the word "Hi" with a code of "0", "call" with a code of "100", and "me" with a code of "101" based on the frequency within message 112. Mapping 117 can be associated with language based data models, grammar based data models, and the like. For example, mapping 117 can be a grammar based mapping used to encode/decode message 112 based on grammar rules associated with a language of message 112. In one instance, mapping 117 can support multiple languages, multiple grammar constructions stemming from multiple languages, and the like. In one instance, mapping 117 can permit encoding of common phrases utilized in informal text exchanges which can be represented as abbreviations. In the instance, phrases can be encoded as a single word during encoding and decoded into the original phrase during decoding. For example, a message including the contents "on my way" can be abbreviated as a single word "omw" (e.g., a node of mapping 117) and can be decoded to produce the original phrase "on my way".

In one instance, mapping 117 can be persisted and can be utilized for subsequent message 112, 120 encoding/decoding. In the instance, mapping 117 can be optionally optimized with each encoding/decoding to attain maximum performance. Utilizing ruleset 119 and mapping 117, a bit sequence 122 representing message 112 can be generated. For example, each word of message 112 can be translated into a bit sequence based on nodes within mapping 117. The bit sequence can be concatenated together to produce encoded message 120.

Encoded message 120 can be message 112 contents which are associated with an encoding 170 type. Encoded message 120 can be a binary data set including message 112 data, bit sequence 122, header data, flag 121 and the like. In one embodiment, message 120 can be a packet data unit (e.g., SMS PDU 410) which can be conveyed over a cellular network. In the embodiment, flag 121 can indicate the encoding 170 type utilized to encode the message 112. It should be appreciated that encoded message 120 can be presented as a septet encoding, but is not limited in this regard. Encoded message 120 can be encoded as an octet string, hexadecimal string, and the like. In one embodiment, when message 112 is larger than a single SMS message (e.g., 140 8-bit characters) the message can be encoded as a single SMS and a encoded message 120 can be produced. In the embodiment, if the message 120 is larger than the SMS message limit (e.g., 140 8-bit characters), the message 120 can be appropriately split as a multipart SMS message. It should be appreciated that traditional and/or proprietary mechanisms associated with concatenated SMS can be employed to retain message order and/or message contents prior, during, and post-transmission.

The encoded message 120 can be transmitted 140 from an originating device to a destination device. Transmission 140 can include, wireless transmission, wired transmission, and the like. It should be appreciated that transmission can occur in real-time or near real-time. Transmission 140 can include multiple networks, multiple network entities, and the like. For example, transmission 140 can include the communication of message 120 from a SMS Center (SMSC) associated with a network proximate to device 111 to a SMSC associated with a network proximate to device 156. It should be understood that transmission can include multiple encoded messages 120 when messages 120 are a multipart SMS.

In SMS message decoding 150, the encoded message 120 can be decoded displayed within phone 156. Decoding 150 can include, but is not limited to, encoding identification 152 step, decoding 154 step, and the like. The encoded message 120 can be decomposed and flag 121 can be analyzed to determine the encoding 170 type associated with the message

120. Encoding identification 152 can select mapping 117 based on encoding 170 type. Utilizing an appropriate ruleset 117 (e.g., associated with mapping 117), message 120 can be decoded. Decoding 154 can include, concatenation of bit sequences, character set translation, and the like. For example, bit sequence 122 can be decoded into message 112 using mapping 117. Decoding 154 can yield message 112 which can be presented upon device 156 (e.g., within a text messaging application).

It should be appreciated that mapping 117 and/or ruleset 119 can be shared between devices performing encoding/decoding. In one embodiment, mapping 117 and/or ruleset 119 can be communicated as a portion of a session initiation procedure. In another instance, mapping 117 and/or ruleset 119 can be manually provisioned to each device performing encoding/decoding. In one instance, mapping 117 can be generated independently by an encoding device and/or decoding device. In the instance, when encoding and decoding device share an identical dictionary, mapping 117 can be automatically generated within each device. For example, many mobile models often share the same dictionary (e.g., auto-correct dictionary) which can be employed for the generation of an identical mapping 117 and/or ruleset 119.

As used herein, SMS can be a text messaging service associated with a text messaging component of a phone, Web, or mobile communication system. The communication system can utilize standard and/or proprietary communications protocols which allow the exchange of text messages (e.g., SMS message 112) between fixed line and/or mobile computing devices. The communication system can include, but is not limited to Global System for Mobile Communications (GSM) compliant systems, Code Division Multiple Access 2000 (CDMA2000) compliant systems, and the like. SMS can include, but is not limited to, SMS Point-to-Point (SMS-PP), SMS Cell Broadcast (SMS-CB), and the like. SMS can conform to 3rd Generation Partnership Project (3GPP) Technical Specification (TS) 23.040, 3GPP TS 23.041, and the like.

SMS message 112 can be a text exchange message associated with a text messaging component of a phone, Web, or mobile communication system. Message 112 length can conform to a 160 7-bit character message, a 140 8-bit character message, or a 70 16-bit character message. It should be appreciated that message 112 lengths can be less than the described lengths. That is, a message 112 can be an 8-bit alphabet message 50 characters in length. For example, SMS messages often include a few words such as "wait for me". Message 112 can conform to service limitations of a Mobile Application Part (MAP) specification of the Signaling System 7 (SS7) protocol. Message 112 can include one or more languages including, but not limited to English, Italian, Spanish, French, Arabic, Chinese, Korean, Japanese, Russian, Serbian, Bulgarian, Hindi, and the like. It should be appreciated that SMS message 112 can include multipart SMS messages.

Drawings presented herein are for illustrative purposes only and should not be construed to limit the invention in any regard. Scenario 100 can include additional encoding artifacts such as encoding artifacts 440 not presented within the scenario 100. It should be appreciated that encoding 110 can be performed prior to transmission 140 (e.g., conveying to phone 111) and decoding 150 can be performed after transmission 140 (e.g., receiving at phone 156). In one instance, encoding 110 and decoding 150 can be performed during transmission 140.

Figure 2:
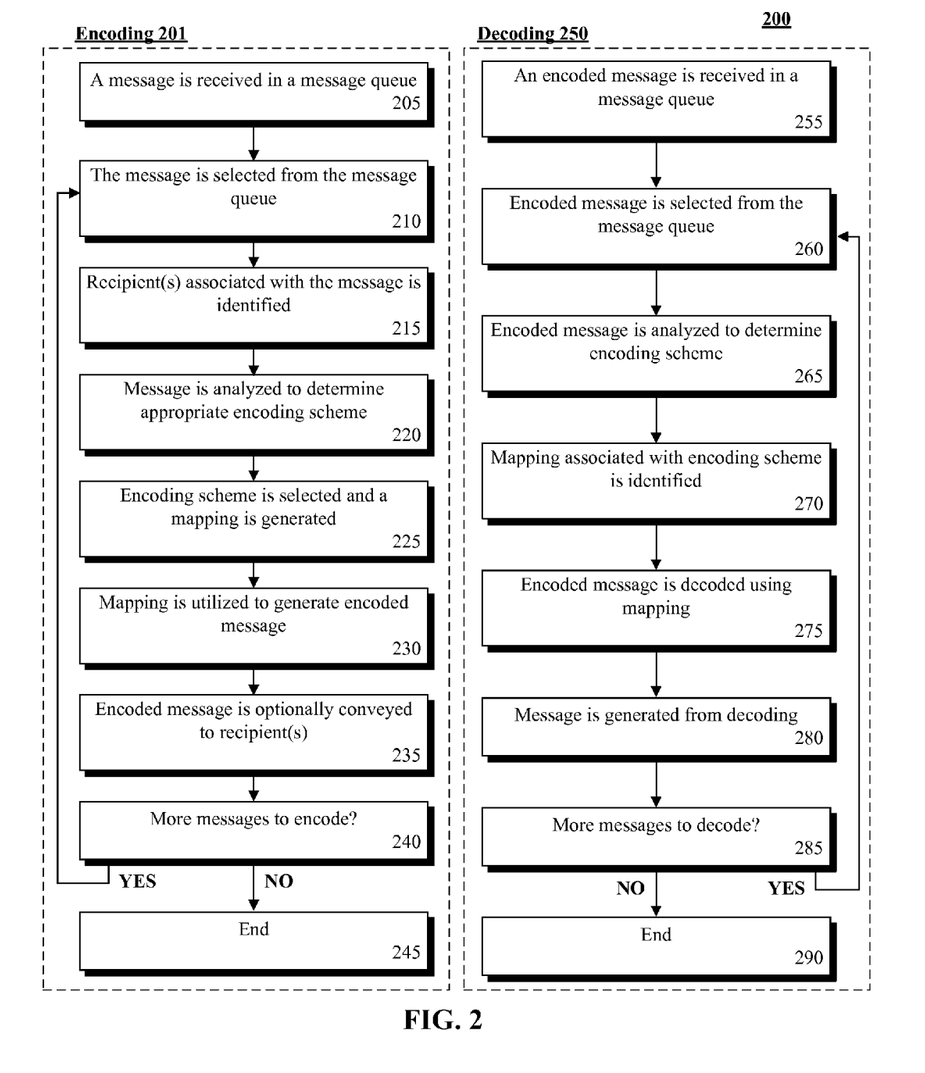
FIG. 2 is a schematic diagram illustrating a method for leveraging language structure to dynamically compress a SMS message in accordance with an embodiment of the inventive arrangements disclosed herein.

FIG. 2 is a schematic diagram illustrating a method 201, 250 for leveraging language structure to dynamically compress a SMS message in accordance with an embodiment of the inventive arrangements disclosed herein. Method 201, 250 can be performed in the context of scenario 100, system 300, embodiment 410, 440. In method 201, a message can be encoded using an intelligent selection of word, language, and/or grammar encoding schemes. In method 250, an encoded message can be decoded using a previously selected word, language, and/or grammar encoding scheme. In method 201, 250, the message can include, but is not limited to, a Short Message Service (SMS) message, an electronic mail, a text exchange message, and the like. The message can be stored within a message queue of a software. For example, queue can be a message queue of a text exchange application.

In step 205, a message can be received within a message queue. In step 210, the message can be selected from the message queue. Selection can be dependent on one or more criteria. Criteria can include, message length, message priority, message age, message recipients, and the like. In step 215, recipients associated with the message can be identified. Recipients can be identified in one or more traditional and/or proprietary means (e.g., header analysis). In step 220, the message can be analyzed to determine an appropriate encoding scheme. Analysis can include, but is not limited to, lexical analysis, language determination, grammar construction, phrase determination, and the like. In one embodiment, analysis can be utilized to determine potential resource savings from compressing the message. In the embodiment, traditional and/or proprietary predictive analysis can be leveraged to determine when compression is suitable for message. When encoding is suitable (e.g., reduction in message size/length), the encoding can be performed. When the encoding is not suitable, the encoding can be skipped and optionally delivered.

In one embodiment, analysis can include examination of historic encoding schemes to determine optimal encoding choices. In step 225, an encoding scheme can be selected and a mapping can be generated. It should be appreciated that mapping can be generated in accordance with one or more rulesets (e.g., ruleset 314). In step 230, the mapping can be utilized to generate an encoded message. In step 235, the encoded message can be optionally conveyed to one or more recipients. In step 240, if there are more messages to encode, the method can return to step 210, else continue to step 245. In step 245, the method can end. It should be understood that steps 210-235 can be performed concurrently on multiple messages.

In step 255, an encoded message can be received within a message queue. In step 260, the encoded message can be selected from the message queue. In step 265, the encoded message can be analyzed to determine the encoding scheme utilized to encode the message. Analysis can include, but is not limited to, packet decomposition, byte reordering, checksum evaluation, and the like. For example, if the encoded message checksum evaluation fails, the decoding of the encoded message can be aborted. In step 270, encoded message can decoded using a mapping associated with the encoding scheme. In step 280, the message can be generated from the decoding. In step 285, if there are messages to decode, the method can return to step 260, else continue to step 290. In step 290, the method can end. It should be understood that steps 260-280 can be performed concurrently on multiple messages.

Drawings presented herein are for illustrative purposes only and should not be construed to limit the invention in any regard. Method 201, 250 can be performed in parallel (e.g., on different messages), in serial, and the like. Method 201, 250 can be executed in real-time or near real-time.

Figure 3:
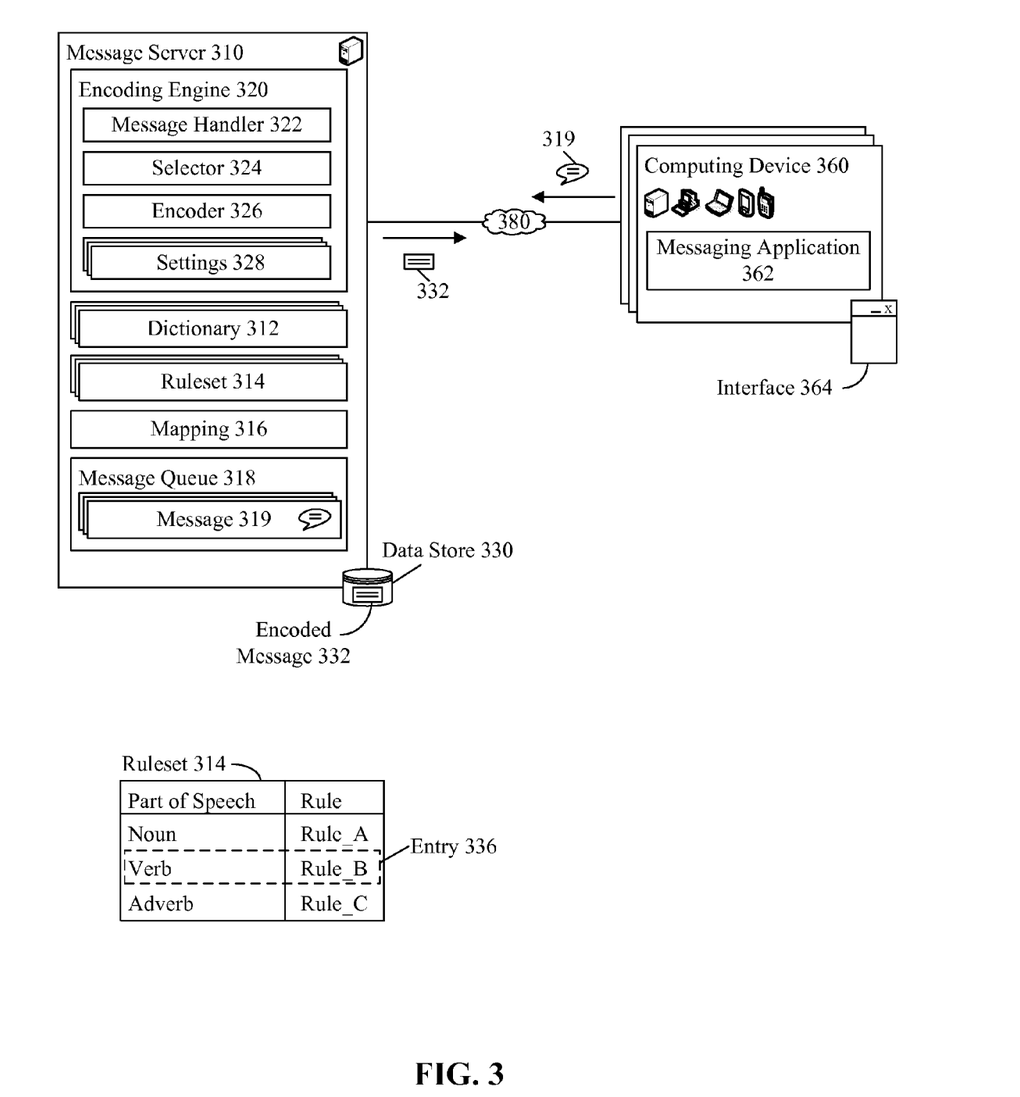
FIG. 3 is a schematic diagram illustrating a system for leveraging language structure to dynamically compress a SMS message in accordance with an embodiment of the inventive arrangements disclosed herein.

FIG. 3 is a schematic diagram illustrating a system for leveraging language structure to dynamically compress a SMS message in accordance with an embodiment of the inventive arrangements disclosed herein. System 300 can be present in the context of scenario 100, method 200, and/or embodiment 410, 440. System 300 components can be communicatively linked via network 380. In system 300, an encoding engine 320 can receive a message 319 from computing device 360. The message 319 can be encoded using mapping 316 resulting in encoded message 332. The encoded message 332 can be conveyed to a different computing device. The different computing device can decode the message 332 and produce the original message 319 contents.

In one embodiment, engine 320 can be present within an endpoint computing device for enabling maximum network load reduction. In the embodiment, engine 320 can be a component of a messaging application 362. In another embodiment, engine 320 functionality can be a service executing within computing device 360. In yet another embodiment, engine 320 can be a networked computing element residing within a networked computing environment. For example, engine 320 can be present within an SMS Center (SMSC) when computing device 360 has limited resources.

In one instance, engine 320 can be a functionality of a transport layer of an Open Systems Interconnect OSI model associated with a communication stack. In another instance, engine 320 can be a functionality of an application layer of an Open Systems Interconnect OSI model associated with a communication stack.

Message server 310 can be a hardware/software element for exchanging text messages between computing devices 360. Server 310 can include, but is not limited to, an encoding engine 320, a dictionary 312, a ruleset 314, a mapping 316, a message queue 318, a data store 330, and the like. In one instance, server 310 can be an IBM WEBSPHERE APPLICATION server. Server 310 can receive request (e.g., message 319) from clients (e.g., devices 360) and can communicate a response (e.g., encoded message 332) to one or more clients (e.g., devices 360). In one instance, server 310 can be an electronic mail server able to dynamically encode and/or decode message 319 utilizing word, language, and grammar commonalities. In another instance, server 310 can be a carrier-grade communications server of a communications network.

Encoding engine 320 can be a hardware/software component for communicating message 319 and/or encoded message 332. Engine 320 functionality can include, but is not limited to, encryption, message forwarding, and the like. Engine 320 can include, but is not limited to, message handler 322, selector 324, encoder 326, and the like. In one instance, engine 320 can be a component of a networked computing environment. In the instance, engine 320 functionality can be accessible as a network service. For example, an engine 320 can be a component of a network server which can perform encoding and/or decoding of messages associated with a proximate end-point device (e.g., recipient). In one instance, engine 320 can be a component of a messaging application 362. For example, engine 320 can be a plug-in element of an e-mail application. In one embodiment, engine 320 can be a component of an IBM WEBSPHERE MQ middleware software.

Message handler 322 can be a hardware/software element able to receive and/or convey message 319 and/or encoded message 332. Handler 322 functionality can include, message storage functionality, message management capabilities (e.g., sorting), recipient verification, media conversion, and the like. In one instance, handler 332 can be utilized to determine the message 319, 332 content state. In the instance, handler 332 can analyze message 319, 322 to identify appropriate operations to be performed.

Selector 324 can be a hardware/software component configured to analyze message 319 to determine an encoding scheme to apply to the message. Selector functionality can include lexical analysis, message selection, predictive analysis, and the like. Selector 324 can be utilized to determine a message 319 can be encoded. For example, if the message is less than three words, encoding can be omitted. In one embodiment, selector 324 can be used to determine an encoding scheme to be applied to message 319. In the embodiment, one or more rulesets can be utilized to determine an encoding scheme to apply to encode message 319. Selector 324 can be utilized to set appropriate encoding flags within a message 319. In one instance, selector 324 can toggle the encoding flag (e.g., encoding flag 414) of an SMS message to indicate message content type (e.g., encoded or decoded).

Encoder 326 can be a hardware/software element for encoding and/or decoding message 319 using an encoding scheme. The encoding scheme can include, but is not limited to, a word level encoding scheme, a language-based encoding scheme, and a grammar encoding scheme. Encoder 326 functionality can include, but is not limited to, data compression, tree traversal (e.g., mapping 319 traversal) dictionary 312 creation, ruleset 314 generation, mapping 316 creation, and the like. In one embodiment, encoder 326 can include one or more Huffman coding algorithms. Huffman coding algorithms can include, but is not limited to, adaptive Huffman coding, Huffman template algorithm, Hu-Tucker coding, and the like.

Setting 328 can be one or more rulesets for configuring the behavior of engine 320, server 310, and/or system 300 components. Setting 328 can include, but is not limited to, message forwarding settings, encryption settings, user preferences, application settings (e.g., application 362), dictionary 312, ruleset 314, mapping 316, and the like. In one instance, setting 328 can be manually and/or heuristically determined. In one embodiment, settings 328 can be configured via a user interface (e.g., interface 364).

Dictionary 312 can be a text and/or binary dataset utilized in creating mapping 316. In one embodiment, dictionary 312 can be generated from a known probability model. For example, dictionary 312 can be similar to a dictionary 442 which include probability data associated with common words found in messages. In one instance, dictionary 312 can be created in real-time or near real-time. In another instance, dictionary 312 can be previously generated. Dictionary 312 can be generated algorithmically utilizing one or more traditional and/or proprietary application programming interfaces (API).

Ruleset 314 can be one or more rules associated with encoding and/or decoding message 319, 332. Ruleset 314 can conform to a traditional and/or proprietary syntax, a keyword based syntax, natural language based syntax, and the like. Ruleset 314 can be manually and/or automatically generated. In one instance, grammatical constructs can be used to execute language specific actions. In the instance, ruleset 314 can include parts of speech rules which indicate which words of a message to encode/decode. For example, when a verb is encountered during encoding, entry 336 can be utilized to trigger the execution of a Rule_B. That is, Rule_B can be a grammar rule (e.g., ruleset 446) permitting intelligent encoding of parts of speech. For example, when the word "ran" in a message is detected, a Rule_B can trigger the encoding of "ran" as the infinitive form of the verb "run".

Mapping 316 can be a variable length code data set for encoding/decoding message 319 and/or message 332. Mapping 316 can include, but is not limited to, a binary tree, an optimal alphabetic binary tree, a binary search tree, and the like. For example, mapping 316 can be a Huffman tree. In one instance, mapping 316 can be manually and/or automatically optimized. In one embodiment, mapping 316 can be established from one or more dictionaries 312.

Message queue 318 can be a software element for storing and/or forwarding message 319, message 332. Queue 318 can be a First In Last Out (FILO) queue, Last In First Out (LIFO) queue, First In First Out (FIFO), and the like. Queue 318 can communicate with engine 320 to encode and/or decode received messages (e.g., message 319, 332). In one instance, queue 318 can be a portion of data store 330.

Computing device 360 can be a software/hardware element for executing messaging application 362. Device 360 can include, but is not limited to messaging application 362, interface 364, and the like. Hardware can include, but is not limited to, a processor, a non-volatile memory, a volatile memory, a bus, and the like. Computing device 360 can include, but is not limited to, a desktop computer, a laptop computer, a mobile phone, a mobile computing device, a portable media player, a Personal Digital Assistant (PDA), and the like.

Messaging application 362 can be a software entity able to generate message 319 and/or 332. Application 362 can include, but is not limited to, a text exchange (e.g., instant messenger) application, an SMS messaging application, an e-mail application, and the like. Application 362 can include conventional and/or proprietary technologies. Technologies can include, but is not limited to, JAVA, C++, and the like. Application 362 can be communicatively linked to interface 364 permitting presentation of message 319 and/or message 332 within the interface 364.

Interface 364 can be a user interactive component permitting creation and/or presentation of message 319. Interface 364 can be present within the context of a Web browser application, a native executable application, and the like. Interface 334 capabilities can include a graphical user interface (GUI), voice user interface (VUI), mixed-mode interface, and the like. In one instance, interface 334 can be communicatively linked to computing device 360.

Data store 330 can be a hardware/software component able to persist encoded message 332. In one instance, data store 330 can persist dictionary 312, ruleset 314, mapping 316, message 319, and the like. Data store 330 can be a Storage Area Network (SAN), Network Attached Storage (NAS), and the like. Data store 330 can conform to a relational database management system (RDBMS), object oriented database management system (OODBMS), and the like. Data store 330 can be communicatively linked to server 310 in one or more traditional and/or proprietary mechanisms. In one instance, data store 330 can be a component of Structured Query Language (SQL) complaint database.

Network 380 can be an electrical and/or computer network connecting one or more system 300 components. Network 380 can include, but is not limited to, twisted pair cabling, optical fiber, coaxial cable, and the like. Network 380 can include any combination of wired and/or wireless components. Network 380 topologies can include, but is not limited to, bus, star, mesh, and the like. Network 380 types can include, but is not limited to, Local Area Network (LAN), Wide Area Network (WAN), Virtual Private Network (VPN) and the like. In one instance, network 380 can include one or more networks including, but not limited to, a Global System for Mobile Communications (GSM) mobile core network, a Universal Mobile Telecommunications System (UMTS) mobile core network, a General Packet Radio Service (GPRS) core network, and the like.

Drawings presented herein are for illustrative purposes only and should not be construed to limit the invention in any regard. It should be appreciated that engine 320 can perform decoding operations on encoded message 332. It should be appreciated that one or more components within system 300 can be optional components permitting that the disclosure functionality be retained. It should be understood that engine 320 components can be optional components providing that engine 320 functionality is maintained. It should be appreciated that one or more components of engine 320 can be combined and/or separated based on functionality, usage, and the like. It should be understood that system 300 can conform to a Service Oriented Architecture, Representational State Transfer (REST) architecture, and the like. It should be appreciated that the disclosure functionality can be present within a messaging API.

FIG. 4 is a schematic diagram illustrating an embodiment for a Short Message Service (SMS) packet data unit (PDU) 410 and encoding artifacts 440 for leveraging language structure to dynamically compress a SMS message in accordance with an embodiment of the inventive arrangements disclosed herein. PDU 410 and encoding artifacts 440 can be present in the context of scenario 100, method 200, and/or system 300.

The SMS PDU 410 can be a communications packet dataset associated with a SMS message. PDU 410 can be a collection of meta information (e.g., a string data type) including, but not limited to, a sender, SMS center information, a timestamp, a message, and the like. PDU 410 can conform to hexadecimal octets, decimal semi-octets, and the like. In PDU 410, a TP_Protocol_Identifier 412 of the PDU 410 can be leveraged to enable encoding of a message. In one embodiment, bit six and bit seven of a TP_Protocol_Identifier 412 can be utilized as an encoding flag 414 to indicate the message state (e.g., encoded or decoded). In another embodiment, a Transaction Identifier conforming to the call control (CC) protocol of a Connection Management (CM) sublayer can be utilized. In the embodiment, a reserved Bit 8 can be employed to store information about encoding.

Encoding artifact 440 can be one or more artifacts for enabling message encoding within the disclosure. Artifacts 440 can include, but is not limited to, dictionary 442, encoding tables 444, ruleset 446, and the like. Dictionary 442 describes an exemplary dataset which can be employed during encoding of a message. Encoding tables 444 can be utilized to encode parts of speech which can have multiple forms (e.g., verbs, adverbs). In one instance, tables 444 can include a verbal tense table which can associate a verb tense with a binary code and a verb agreement table which can associate a person plurality and a binary code. Ruleset 446 can be an exemplary ruleset for encoding a message based on language and/or grammar. Ruleset 446 can include natural language syntax, formalized syntax, and the like.

The flowchart and block diagrams in the FIGS. 1-4 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method comprising:
identifying, via a processor executing programmatic instructions stored in a non-transitory storage medium, a Short Message Service (SMS) message within a message queue within a software entity of a computing device, wherein the SMS message is restricted by constraints of a SMS signaling protocol used to transmit the SMS message, wherein said restriction imposes a constraint of a limited number upon the SMS message;
analyzing, via a processor executing programmatic instructions stored in a non-transitory storage medium, a language structure of a human communication language used for content of the SMS message to determine an encoding scheme to apply to the SMS message, wherein the determined encoding scheme leverages the language structure to dynamically compress the SMS message by leveraging the language structure to include fewer characters in an encoded SMS message compared to a number of characters present in the SMS message; and
encoding, via a processor executing programmatic instructions stored in a non-transitory storage medium, the SMS message using the encoding scheme to create the encoded message that has been dynamically compressed by leveraging the language structure, wherein the encoding scheme is at least one of a word level encoding scheme, a language-based encoding scheme, and a grammar encoding scheme.

2. The method of claim 1, further comprising:
a decoder identifying a decoding scheme associated with the encoded.

3. The method of claim 1, wherein the word level encoding scheme creates a link between a word in a dictionary and a bit sequence, wherein words within the SMS message occurring in higher frequency are associated with a shorter bit sequence than words within the SMS message occurring with less frequency.

4. The method of claim 1, wherein the language-based encoding scheme does not encode an article part of speech present in the SMS message when creating the encoded message.

5. The method of claim 1, wherein the grammar encoding scheme encodes a conjugated verb part of speech present in the SMS message as an infinitive form of the conjugated verb when creating the encoded message.

6. The method of claim 1, wherein the computing device is at least one of a mobile phone, a message server, a desktop computer, and a portable computing device.

7. The method of claim 1, further comprising:
previously ranking words in a dictionary based on the frequency of usage in the SMS message; and
creating a mapping data structure defining a link between each word in the dictionary and a bit sequence according to Huffman algorithm, wherein the frequency of each word is inversely proportional to the length of the bit sequence.

8. The method of claim 1, wherein the computing device is a device associated with a SMS Center (SMSC).

9. The method of claim 1, wherein the encoding and decoding scheme is associated with a prefix-free binary code.

10. A system comprising:
one or more processors;
one or more non-transitory storage mediums comprising program instructions that are executed by the one or more processors;
a transmission engine, comprising at least a subset of the program instructions that when executed by the one or more processors encode a Short Message Service (SMS) message within a message queue within a software entity of a computing device, wherein the SMS message is restricted by constraints of a SMS signaling protocol used to transmit the SMS message, wherein said restriction imposes a constraint of a limited number upon the SMS message, wherein content of the SMS message uses a human communication language having a language structure, wherein encoding is associated with a word level encoding scheme, a language-based encoding scheme, and a grammar encoding scheme, wherein the encoding leverages the language structure to dynamically compress the SMS message by leveraging the language structure to include fewer characters in an encoded SMS message compared to a number of characters present in the SMS message; and
a data store, comprising at least a subset of the non-transitory storage mediums, able to persist a mapping associated with the SMS message, wherein the mapping indicates the encoding scheme or the decoding scheme associated with the SMS message within the message queue.

11. The system of claim 10, further comprising:
a message handler, comprising at least a subset of the program instructions that when executed by the one or more processors identify a message within a message queue within the software entity;
a selector, comprising at least a subset of the program instructions that when executed by the one or more processors analyze the SMS message to determine an encoding scheme to apply to the SMS message; and
an encoder, comprising at least a subset of the program instructions that when executed by the one or more processors encode or decode the message using the encoding scheme, wherein the encoding scheme is at least one of a word level encoding scheme, a language-based encoding scheme, and a grammar encoding scheme.

12. The system of claim 10, wherein the encoding scheme is indicated in the message within the TP_Protocol_Identifier field of an SMS message.

13. The system of claim 10, wherein the encoding and decoding scheme is associated with a prefix-free binary code.

14. The system of claim 10, wherein the SMS message is a multipart SMS message, wherein each concatenated message of the multipart SMS message is encoded with at least one of the encoding scheme.

15. A method comprising:
detecting, via a processor executing programmatic instructions stored in a non-transitory storage medium, a Short Message Service (SMS) message within a message queue having multiple endpoint device recipients, wherein the message queue is associated with a SMS Center (SMSC), wherein the SMS message is restricted by constraints of a SMS signaling protocol used to transmit the SMS message, wherein said restriction imposes a constraint of a limited number upon the SMS message;

selecting, via a processor executing programmatic instructions stored in a non-transitory storage medium, an encoding scheme to encode the SMS message based on at least one ruleset, wherein the selected encoding scheme leverages a language structure to dynamically compress the SMS message by leveraging the language structure to include fewer characters in an encoded SMS message compared to a number of characters present in the SMS message, the language structure being a structure of a human communication language used for content of the SMS message;

encoding, via a processor executing programmatic instructions stored in a non-transitory storage medium, the SMS message using an encoding scheme, wherein the encoding scheme is a word level encoding scheme, a language-based encoding scheme, and a grammar encoding scheme;

generating, via a processor executing programmatic instructions stored in a non-transitory storage medium, an encoded message associated with the encoding scheme, wherein said encoded message has been dynamically compressed by leveraging the language structure; and conveying, via a processor executing programmatic instructions stored in a non-transitory storage medium, the encoded message to at least one of a proximate network element communicatively linked to an endpoint device recipient of the encoded message and an endpoint device recipient of the encoded message.

16. The method of claim 15, further comprising:

decoding, via a processor executing programmatic instructions stored in a non-transitory storage medium, the encoded message using the selected encoding scheme, wherein the decoding is performed by the proximate network element communicatively linked to the endpoint device recipient; and reproducing, via a processor executing programmatic instructions stored in a non-transitory storage medium, exactly and in entirety the SMS message.

17. The method of claim 16, wherein the SMS message is conveyed to at least one of the multiple endpoint device recipients.

18. The method of claim 15, wherein the encoding scheme is indicated in the SMS message within the TP_Protocol_Identifier field of the encoded message.

* * * * *